(12) United States Patent
Tai et al.

(10) Patent No.: US 12,266,661 B2
(45) Date of Patent: Apr. 1, 2025

(54) ELECTRONIC DEVICE

(71) Applicant: Innolux Corporation, Miao-Li County (TW)

(72) Inventors: Ming-Jou Tai, Miao-Li County (TW); Chia-Hao Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/359,897

(22) Filed: Jul. 27, 2023

(65) Prior Publication Data

US 2023/0387142 A1 Nov. 30, 2023

Related U.S. Application Data

(63) Continuation of application No. 17/073,402, filed on Oct. 19, 2020, now Pat. No. 11,756,963.

(60) Provisional application No. 62/933,987, filed on Nov. 12, 2019, provisional application No. 62/933,986, filed on Nov. 12, 2019.

(30) Foreign Application Priority Data

Aug. 18, 2020 (CN) .......................... 202010830552.0

(51) Int. Cl.
*H01L 27/12* (2006.01)

(52) U.S. Cl.
CPC .................................. *H01L 27/124* (2013.01)

(58) Field of Classification Search
CPC ............ G02F 1/136227; H01L 27/124; H01L 27/1225; H01L 29/7869; H01L 29/41733; H01L 29/78648
See application file for complete search history.

(56) References Cited

U.S. PATENT DOCUMENTS

| | | | |
|---|---|---|---|
| 2011/0037072 A1* | 2/2011 | Moriwaki | H01L 27/124 257/59 |
| 2017/0053947 A1* | 2/2017 | Makita | H01L 27/1225 |
| 2017/0110528 A1* | 4/2017 | Kim | H01L 29/78648 |
| 2019/0311943 A1* | 10/2019 | Wan | H01L 27/124 |
| 2020/0089037 A1* | 3/2020 | Yoshino | G02F 1/136227 |
| 2020/0343269 A1* | 10/2020 | Su | H01L 27/124 |

* cited by examiner

*Primary Examiner* — Peter M Albrecht
(74) *Attorney, Agent, or Firm* — JCIPRNET

(57) ABSTRACT

An electronic device, including a substrate, a thin film transistor, a first insulating layer, a pixel electrode, and a common electrode, is provided. The thin film transistor is disposed on the substrate and includes an electrode. The first insulating layer is disposed on the thin film transistor and includes a first opening. The pixel electrode is disposed on the first insulating layer and electrically connected to the electrode through the first opening. The common electrode is disposed on the pixel electrode and in the first opening.

7 Claims, 4 Drawing Sheets

ELECTRONIC DEVICE

CROSS-REFERENCE TO RELATED APPLICATION

This application is a continuation application of and claims the priority benefit of a prior application Ser. No. 17/073,402, filed on Oct. 19, 2020. The prior application Ser. No. 17/073,402 claims the priority benefits of U.S. provisional application Ser. No. 62/933,986, filed on Nov. 12, 2019, U.S. provisional application Ser. No. 62/933,987, filed on Nov. 12, 2019, and China application serial no. 202010830552.0, filed on Aug. 18, 2020. The entirety of each of the above-mentioned patent applications is hereby incorporated by reference herein and made a part of this specification.

BACKGROUND

Technical Field

The disclosure relates to an electronic device, and more particularly to an electronic device that can improve the electron transfer between the pixel electrode and the drain.

Description of Related Art

Flat display panels have been widely applied in electronic equipment such as mobile phones, televisions, monitors, tablet computers, car displays, wearable devices, and desktop computers. With the vigorous development of electronic products, the requirements for the display quality of the electronic products are getting higher and higher, so that the electronic devices for display are continuously improving towards larger or higher resolution display effects.

SUMMARY

The disclosure provides an electronic device, which can improve the electron transfer between the pixel electrode and the drain.

According to an embodiment of the disclosure, the electronic device includes a substrate, a thin film transistor, a first insulating layer, a pixel electrode, and a common electrode. The thin film transistor is disposed on the substrate and includes an electrode. The first insulating layer is disposed on the thin film transistor and includes a first opening. The pixel electrode is disposed on the first insulating layer and electrically connected to the electrode through the first opening. The common electrode is disposed on the pixel electrode and in the first opening.

According to an embodiment of the disclosure, the electronic device includes a substrate, a thin film transistor, a first insulating layer, and a pixel electrode. The thin film transistor is disposed on the substrate and includes a gate. The first insulating layer is disposed on the thin film transistor and includes a first opening. The pixel electrode is disposed on the first insulating layer and electrically connected to the thin film transistor through the first opening. The first opening overlaps the gate.

Based on the foregoing, in the display device according to the embodiments of the disclosure, the pixel electrode may be electrically connected to the transfer pad through the first opening of the first insulating layer, and the transfer pad may be electrically connected to the drain. Since the width of the first opening is greater than the width of the drain, and the width of the first opening is smaller than the width of the transfer pad, the contact area between the pixel electrode and the transfer pad may be increased. In this way, the display device of the embodiments can improve the electron transfer between the pixel electrode and the drain by the configuration of the transfer pad to reduce the resistance between the pixel electrode and the drain, and improve the display quality of the display device.

BRIEF DESCRIPTION OF THE DRAWINGS

The drawings are included for further understanding of the disclosure. The drawings are incorporated into the specification and constitute a part of the specification. The drawings illustrate the embodiments of the disclosure, and are used to explain the principles of the disclosure together with the descriptions.

DETAILED DESCRIPTION OF DISCLOSED EMBODIMENTS

Figure 1A:
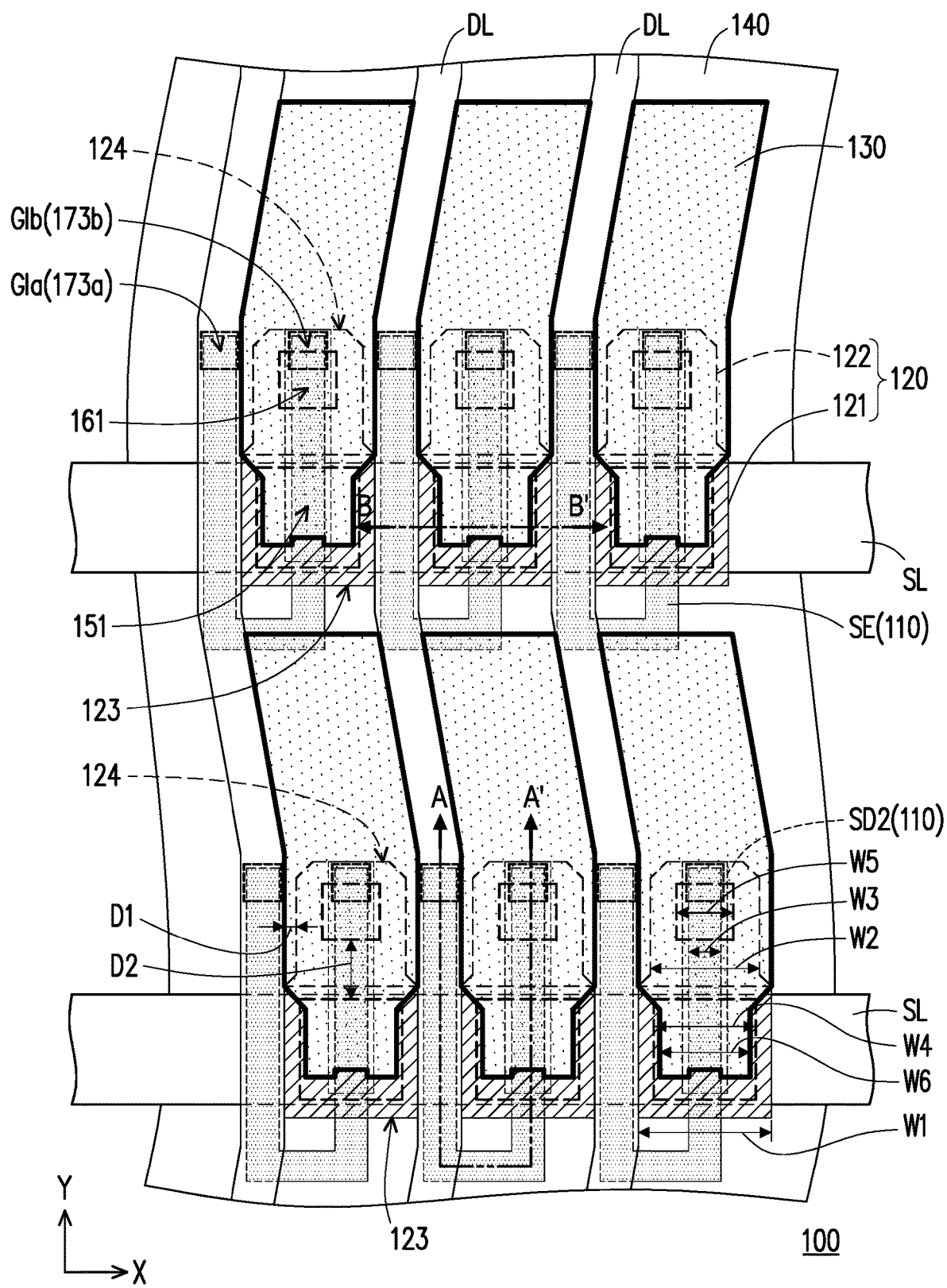
FIG. 1A is a schematic top view of a display device according to an embodiment of the disclosure.

This disclosure may be understood by referring to the following detailed descriptions in conjunction with the drawings. It should be noted that for the readers to easily understand and for the simplicity of the drawings, the multiple drawings in the disclosure only depict a part of an electronic device, and the specific elements in the drawings are not drawn according to actual scale. In addition, the number and size of each element in the drawings are only for illustration, and are not intended to limit the scope of the disclosure.

In the following specification and claims, words such as "comprising", "containing" and "including" are open-ended words, which should be interpreted as having the meaning of "containing but not limited to . . . ".

It should be understood that when an element or a film layer is referred to as being "on" or "connected to" another element or film layer, the former may be directly on the other element or film layer or directly connected to the other element or film layer, or there may be an element or a film layer inserted between the two (indirect case). Conversely, when an element is referred to as being "directly on" or "directly connected to" another element or film layer, there is no element or film layer inserted between the two.

Although the terms first, second, third . . . may be used to describe various constituent elements, the constituent elements are not limited thereto. The terms are only used to distinguish a single constituent element from other constituent elements in the specification. The same terms may not be used in the claims, but replaced with first, second, third . . . according to the order declared by the elements in the claims. Therefore, in the following specification, the first component may be the second component in the claims.

In some embodiments of the disclosure, terms such as "connection" and "interconnection" regarding bonding and connection, unless specifically defined, may mean that two structures are in direct contact, or that two structures are not in direct contact and there is another structure disposed between the two structures. Moreover, the terms regarding bonding and connection may also include the cases where two structures are movable or two structures are fixed. In addition, the term "coupled" includes any direct and indirect electrical connection means.

In the disclosure, the length and the width may be measured by adopting an optical microscope, and the thickness may be measured by a cross-sectional image in an electron microscope, but not limited thereto. In addition, there may be a certain error in any two values or directions for comparison.

The electronic device of the disclosure may include a display device, an antenna device, a sensing device, a touch display, a curved display, or a free shape display, but not limited thereto. The electronic device may be a bendable or a flexible electronic device. The electronic device may include, for example, a light-emitting diode (LED), liquid crystal, fluorescence, phosphor, quantum dot (QD), other suitable display media, or a combination of the foregoing, but not limited thereto. The LED may include, for example, an organic LED (OLED), an inorganic LED, a mini LED, a micro LED, a QDLED (or QLED), other suitable materials, or any combination of the foregoing, but not limited thereto. The display device may include, for example, a tiled display device, but is not limited thereto. The antenna device may be, for example, a liquid crystal antenna, but not limited thereto. The antenna device may include, for example, an antenna tiled device, but not limited thereto. It should be noted that the electronic device may be any combination of the foregoing, but not limited thereto. In addition, the appearance of the electronic device may be rectangular, circular, polygonal, a shape with curved edges, or other suitable shapes. The electronic device may have peripheral systems such as a driving system, a control system, a light source system, and a shelving system to support the display device, the antenna device, or the tiled device. Hereinafter, the display device will be used to illustrate the content of the disclosure, but the disclosure is not limited thereto.

It should be understood that, without departing from the spirit of the disclosure, the features in several different embodiments may be replaced, recombined, and mixed to complete other embodiments in the following embodiments. The features between the embodiments may be mixed and matched arbitrarily as long as the features do not violate the spirit of the invention or are not conflicting.

References will now be made in detail to the exemplary embodiments of the disclosure, and examples of the exemplary embodiments are illustrated in the drawings. Whenever possible, the same reference numerals are used to indicate the same or similar parts in the drawings and the descriptions.

Figure 1B:
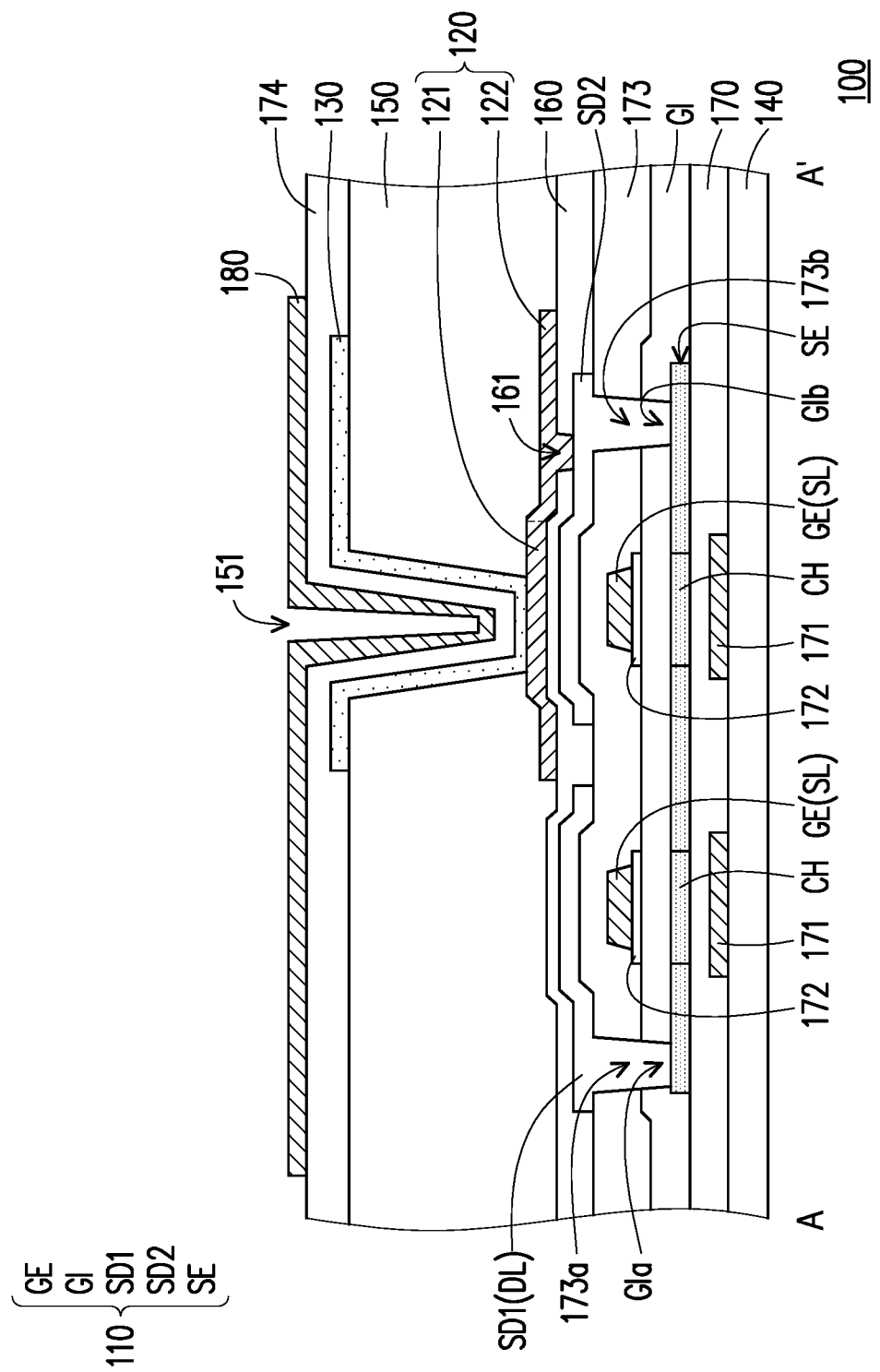
FIG. 1B is a schematic cross-sectional view of the display device of FIG. 1A along a section line A-A'.
Figure 1C:
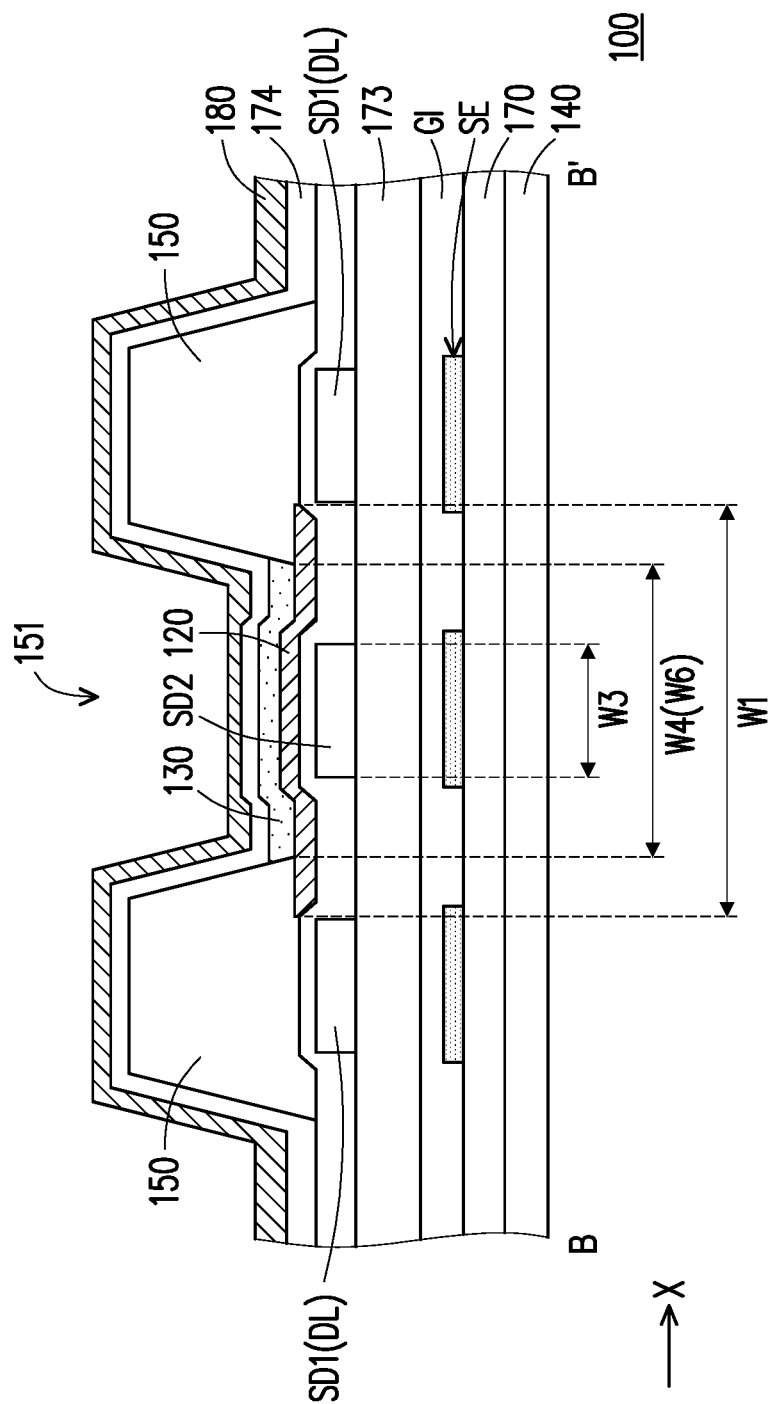
FIG. 1C is a schematic cross-sectional view of the display device of FIG. 1A along a section line B-B'.

FIG. 1A is a schematic top view of a display device according to an embodiment of the disclosure. FIG. 1B is a schematic cross-sectional view of the display device of FIG. 1A along a section line A-A'. FIG. 1C is a schematic cross-sectional view of the display device of FIG. 1A along a section line B-B'. For clarity of the drawings and ease of description, FIG. 1A omits several elements in the display device.

Please refer to FIG. 1A, FIG. 1B, and FIG. 1C at the same time. A display device 100 of the embodiment includes a thin film transistor 110, a transfer pad 120, and a pixel electrode 130. The thin film transistor 110, the transfer pad 120, and the pixel electrode 130 are all disposed on a substrate 140 of the display device 100. In the embodiment, the substrate 140 may include a rigid substrate, a flexible substrate, or a combination of the foregoing. For example, the material of the substrate 140 may include glass, quartz, sapphire, ceramics, polycarbonate (PC), polyimide (PI), polyethylene terephthalate (PET), other suitable substrate materials, or a combination of the foregoing, but not limited thereto.

In the embodiment, the thin film transistor 110 includes a gate GE, a part of a gate insulating layer GI, a source SD1, a drain SD2, and a semiconductor layer SE, but not limited thereto. The gate insulating layer GI may have openings GIa and GIb to expose a part of the semiconductor layer SE. In the embodiment, the material of the source SD1 and/or the drain SD2 may include transparent conductive materials or non-transparent conductive materials, such as indium tin oxide, indium zinc oxide, indium oxide, zinc oxide, tin oxide, metal materials (such as aluminum, molybdenum, copper, silver, etc.), other suitable materials, or a combination of the foregoing, but not limited thereto. The material of the semiconductor layer SE may include amorphous silicon, low-temperature polysilicon (LTPS), metal oxide (such as indium gallium zinc oxide (IGZO)), other suitable materials, or a combination of the foregoing, but not limited thereto. In other embodiments, different thin film transistors may include semiconductor layers of different materials, but not limited thereto.

In the schematic top view of the display device 100 of the embodiment (as shown in FIG. 1A), the display device 100 further includes a scan line SL and a data line DL. The scan line SL and the data line DL are disposed on the substrate 140. The scan line SL extends along a direction X, the data line DL extends along a direction Y, and the direction X is different from the direction Y. Since the source SD1 of the thin film transistor 110 may be electrically connected to the data line DL, and the gate GE of the thin film transistor 110 may be electrically connected to the scan line SL, the thin film transistor 110 may be electrically connected to the data line DL and the scan line SL.

Please refer to FIG. 1A, FIG. 1B and FIG. 1C at the same time again. In the embodiment, the display device 100 further includes a first insulating layer 150 having a first opening 151, a second insulating layer 160 having a second opening 161, a buffer layer 170, a shielding layer 171, an insulating layer 172, a dielectric layer 173, an insulating layer 174, and a common electrode 180. The first insulating layer 150, the second insulating layer 160, the buffer layer 170, the insulating layer 172, the dielectric layer 173, and the insulating layer 174 may be single-layer or multi-layer structures, and may include, for example, organic materials, inorganic materials, or a combination of the foregoing, but not limited thereto. In the embodiment, the material of the shielding layer 171 may be, for example, a metal material or other light shielding materials. In some embodiments, the display device 100 may not be disposed with a shielding layer (not shown).

In the embodiment, the buffer layer 170 and the shielding layer 171 are both disposed between the thin film transistor 110 and the substrate 140, and the shielding layer 171 is disposed corresponding to a channel CH of the gate GE in the semiconductor layer SE. The insulating layer 172 is disposed between the gate GE and the gate insulating layer GI, and the insulating layer 172 is disposed corresponding to the gate GE. The dielectric layer 173 is disposed between the second insulating layer 160 and the gate insulating layer GI to cover the gate GE and the gate insulating layer GI. The dielectric layer 173 may have openings 173a and 173b. The opening 173a is communicated with the opening GIa to expose a part of the semiconductor layer SE, and the opening 173b is communicated with the opening GIb to expose a part of the semiconductor layer SE.

In the embodiment, the source SD1 and the drain SD2 are respectively disposed on the dielectric layer 173. The source SD1 may also be disposed within the opening 173a of the dielectric layer 173 and the opening GIa of the gate insulating layer GI, so that the source SD1 may be electrically connected to the semiconductor layer SE through the opening 173a and the opening GIa. The drain SD2 may also be disposed within the opening 173b of the dielectric layer 173 and the opening GIb of the gate insulating layer GI, so that the drain SD2 may be electrically connected to the semiconductor layer SE through the opening 173b and the opening GIb.

In the embodiment, the second insulating layer 160 is disposed between the transfer pad 120 and the drain SD2. Specifically, the second insulating layer 160 is disposed on the thin film transistor 110. The second insulating layer 160 covers the source SD1, the drain SD2, and the dielectric layer 173. The second insulating layer 160 and the substrate 140 are respectively disposed on opposite sides of the thin film transistor 110. The second insulating layer 160 has a second opening 161, and the second opening 161 exposes a part of the drain SD2.

In the embodiment, the transfer pad 120 may be electrically connected to the drain SD2. Specifically, the transfer pad 120 is disposed on the second insulating layer 160 and is located between the pixel electrode 130 and the drain SD2. The transfer pad 120 may also be disposed within the second opening 161 of the second insulating layer 160, so that the transfer pad 120 may be electrically connected to the drain SD2 through the second opening 161 of the second insulating layer 160. In some embodiments, the transfer pad 120 may be disposed corresponding to the drain SD2. The orthographic projection of the transfer pad 120 on the substrate 140 may overlap with the orthographic projection of the drain SD2 on the substrate 140, and the orthographic projection of the transfer pad 120 on the substrate 140 may be greater than the orthographic projection of the drain SD2 on the substrate 140. In the top view of the display device 100 (as shown in FIG. 1A), the area of the transfer pad 120 may be greater than the area of the drain SD2. In the embodiment, the transfer pad 120 is made of a metal material, and the metal material may include molybdenum (Mo), aluminum (Al), titanium (Ti), copper (Cu), other suitable metals, or an alloy or a combination of the foregoing materials, but not limited thereto. In some embodiments, the material of the transfer pad 120 may also include a transparent conductive material, such as indium tin oxide or indium zinc oxide, but not limited thereto.

In the embodiment, the first insulating layer 150 is disposed between the transfer pad 120 and the pixel electrode 130. Specifically, the first insulating layer 150 is disposed on the transfer pad 120, and the first insulating layer 150 covers the transfer pad 120 and the second insulating layer 160. The first insulating layer 150 and the thin film transistor 110 are respectively disposed on opposite sides of the second insulating layer 160. The first insulating layer 150 has a first opening 151, and the first opening 151 exposes a part of the transfer pad 120. In some embodiments, the first opening 151 of the first insulating layer 150 may be disposed corresponding to the transfer pad 120, but not limited thereto. In some embodiments, a thickness of the first insulating layer 150 may be greater than a thickness of the dielectric layer 173, but not limited thereto. In some embodiments, the first opening 151 overlaps the gate GE, but not limited thereto.

In the embodiment, the pixel electrode 130 is disposed on the first insulating layer 150 and is located between the insulating layer 174 and the first insulating layer 150. The pixel electrode 130 may also be disposed within the first opening 151, so that the pixel electrode 130 may be electrically connected to the transfer pad 120 through the first opening 151 of the first insulating layer 150. In some embodiments, the orthographic projection of the pixel electrode 130 on the substrate 140 overlaps with the orthographic projection of the transfer pad 120 on the substrate 140, but not limited thereto.

In the embodiment, the insulating layer 174 is disposed on the pixel electrode 130 and within the first opening 151. The insulating layer 174 covers the pixel electrode 130 and the first insulating layer 150. The common electrode 180 is disposed on the insulating layer 174 and within the first opening 151, so that the insulating layer 174 is located between the common electrode 180 and the pixel electrode 130.

In detail, in the embodiment, in the top view of the display device 100 (as shown in FIG. 1A), the transfer pad 120 may include a first part 121 corresponding to the first opening 151 and a second part corresponding to the second opening 161 122. The first part 121 of the transfer pad 120 may be exposed by the first opening 151 of the first insulating layer 150, but the second part 122 of the transfer pad 120 is not exposed by the first opening 151 of the first insulating layer 150. The second part 122 of the transfer pad 120 may also be disposed within the second opening 161 of the second insulating layer 160, but the first part 121 of the transfer pad 120 is not disposed within the second opening 161 of the second insulating layer 160. Since the area of the orthographic projection of the transfer pad 120 on the substrate 140 is greater than the area of the orthographic projection of the drain SD2 on the substrate 140, and a width W1 of the first part 121 and a width W2 of the second part 122 of the transfer pad 120 are both greater than a width W3 of the drain SD2, the transfer pad 120 has a greater area to be in contact with the pixel electrode 130 than the drain SD2.

In more detail, in the embodiment, in the top view of the display device 100 (as shown in FIG. 1A), a width W4 of the first opening 151 may be smaller than the width W1 of the first part 121 of the transfer pad 120, and the width W4 of the first opening 151 may be greater than the width W3 of the drain SD2. Then, since the transfer pad 120 has a greater area to be in contact with the pixel electrode 130 than the drain SD2, the width W4 of the first opening 151 corresponding to the transfer pad 120 may also be greater than a width W5 of the second opening 161 corresponding to the drain SD2. In other words, the first contact area of the pixel electrode 130 in contact with the transfer pad 120 through the first opening 151 may be greater than the second contact area of the transfer pad 120 in contact with the drain SD2 through the second opening 161. The size of the contact area may be used to indicate the level of electron transfer, that is, the greater the contact area, the higher the amount of electron transfer, and the smaller the contact area, the lower the amount of electron transfer. Therefore, compared with a display device without the transfer pad, the display device 100 of the embodiment can increase the contact area with the pixel electrode 130 by the configuration of the transfer pad 120 to improve the electron transfer between the pixel electrode 130 and the drain SD2 (that is, the pixel electrode 130 is electrically connected to the drain SD2 through the first opening 151, the transfer pad 120, and the second opening 161) to reduce the resistance between the pixel electrode 130 and the drain SD2, and improve the display quality of the display device 100. In the embodiment, the width W1 of the first part 121, the width W2 of the second part 122, the width W3 of the drain SD2, the width W4 of the first opening 151, and the width W5 of the second opening 161 are, for example, the maximum widths measured along the extending direction (that is, the direction X) of the scan line SL.

In addition, in the embodiment, in the top view of the display device 100 (as shown in FIG. 1A), the width W1 of the first part 121 of the transfer pad 120 may be, for example, greater than the width W2 of the second part 122 of the transfer pad 120, and the transfer pad 120 may form a gourd shape contour. In the embodiment, since the width W1 of the first part 121 of the transfer pad 120 is greater than the width W2 of the second part 122 of the transfer pad 120, and a distance D1 between the second part 122 of the transfer pad 120 and the data line DL may be greater than the distance between the first part 121 of the transfer pad 120 and the data line DL, the parasitic capacitance between the transfer pad 120 and the data line DL (or the source SD1) may be reduced, the phenomenon of cross-talk between the transfer pad 120 and the data line DL (or the source SD1) may be reduced, the problem of uneven brightness of blocks may be avoided.

In addition, in the embodiment, in the top view of the display device 100 (as shown in FIG. 1A), the first opening 151 of the first insulating layer 150 may not overlap with the second opening 161 of the second insulating layer 160. There may be a distance D2 between the first opening 151 of the first insulating layer 150 and the second opening 161 of the second insulating layer 160. In detail, since the first opening 151 of the first insulating layer 150 does not overlap with the second opening 161 of the second insulating layer 160, the insulating layer 174 in the first opening 151 may be formed between the pixel electrode 130 and the common electrode 180, so as to avoid the risk of short circuit due to the contact between the pixel electrode 130 and the common electrode 180. Conversely, when a first opening of a first insulating layer overlaps with a second opening of a second insulating layer (not shown), due to the invert taper of the transfer pad, the insulating layer in the first opening may crack, causing the pixel electrode to be in contact with the common electrode and short circuit.

In addition, in the embodiment, in the cross-sectional view of the display device 100 (as shown in FIG. 1C), since the transfer pad 120 may be disposed on the drain SD2 and may be different stacked layers with the source SD1 (or the data line DL), the widths W1 and W2 of the transfer pad 120 may be greater than the width W4 of the first opening 151. That is, the orthographic projection of the transfer pad 120 on the substrate 140 may partially overlap with the orthographic projection of the first insulating layer 150 on the substrate 140. In the embodiment, in the first opening 151, the widths W1 and W2 of the transfer pad 120 may be greater than a width W6 of the pixel electrode 130. In this way, a relatively flat topography may be provided, so that the insulating layer 174 in the first opening 151 may be formed between the pixel electrode 130 and the common electrode 180, so as to prevent the risk of short circuit due to the contact between the pixel electrode 130 and the common electrode 180. Conversely, in a display device without a transfer pad (not shown), when the width of the drain is smaller than the width of the first opening, so that the edge of the drain is exposed in the first opening, due to the vertical taper or the invert taper of the drain (not shown), the insulating layer in the first opening may crack, causing the pixel electrode to be in contact with the common electrode and short circuit. In the embodiment, the width W6 of the pixel electrode 130 in the first opening 151 is measured, for example, along the extending direction (that is, the direction X) of the scan line SL.

In addition, in the embodiment, in the top view of the display device 100 (as shown in FIG. 1A), the transfer pad 120 has a first side 123 and a second side 124 opposite to each other. The first side 123 is adjacent to the first opening 151, and the second side 124 is adjacent to the second opening 161. The first side 123 may be regarded as the side of the first part 121 of the transfer pad 120 away from the second opening 161, and the second side 124 may be regarded as the side of the second part 122 of the transfer pad 120 away from the first opening 151. In the embodiment, in the extending direction of the data line DL (that is, the direction Y), in two adjacent transfer pads 120, the first side 123 of one transfer pad 120 and the second side 124 of the other transfer pad 120 face each other, and the second side 124 of the one transfer pad 120 and the first side 123 of the other transfer pad 120 back face each other.

In short, in the display device 100 according to the embodiment of the disclosure, the pixel electrode 130 may be electrically connected to the transfer pad 120 through the first opening 151 of the first insulating layer 150, and the transfer pad 120 may be electrically connected to the drain SD2. Since the width W4 of the first opening 151 is greater than the width W3 of the drain SD2, and the width W4 of the first opening 151 is smaller than the width W1 of the transfer pad 120, the contact area between the pixel electrode 130 and the transfer pad 120 may be increased. In this way, the display device 100 of the embodiment can improve the electron transfer between the pixel electrode 130 and the drain SD2 through the configuration of the transfer pad 120 to reduce the resistance between the pixel electrode 130 and the drain SD2, and improve the display quality of the display device 100.

Other embodiments will be exemplified below for illustration. It must be noted here that the following embodiments continue to use the reference numerals and a part of the content of the foregoing embodiment, in which the same reference numerals are used to represent the same or similar elements and the descriptions of the same technical content are omitted. For the descriptions of the omitted parts, references may be made to the foregoing embodiment, which will not be reiterated in the following embodiment.

Figure 2:
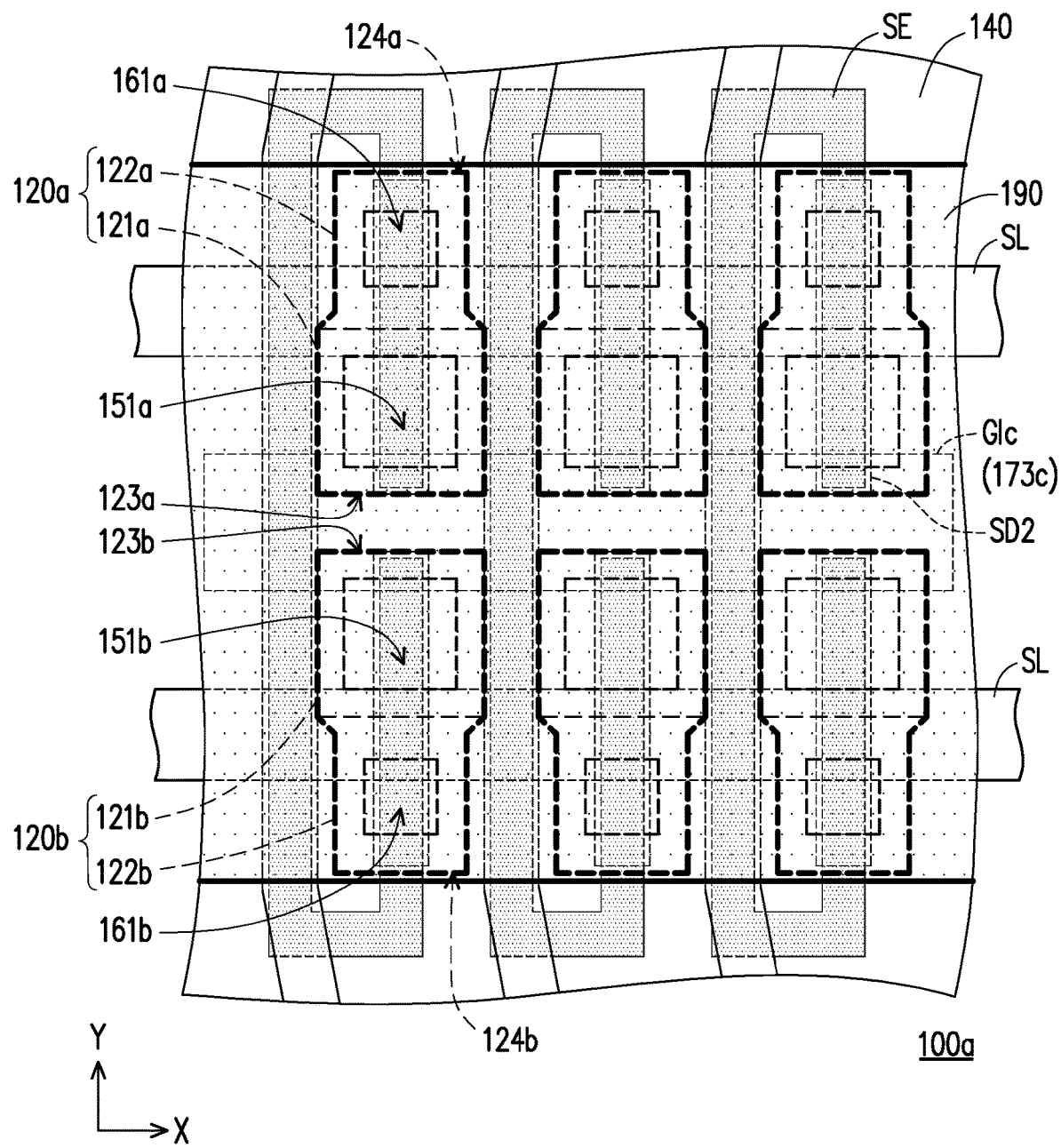
FIG. 2 is a schematic top view of a display device according to another embodiment of the disclosure.

FIG. 2 is a schematic top view of a display device according to another embodiment of the disclosure. For clarity of the drawings and ease of description, FIG. 2 omits depiction of a pixel electrode in the display device. Please refer to FIG. 1A and FIG. 2 at the same time. A display device 100a of the embodiment is substantially similar to the display device 100 of FIG. 1A. Therefore, the same and similar components in the two embodiments are not reiterated here. The display device 100a of the embodiment is different from the display device 100 mainly in that two adjacent pixel electrodes (not shown) in the direction Y of the display device 100a of the embodiment are disposed back-to-back. In addition, in the extending direction (that is, the direction Y) of the data line DL, in two adjacent transfer pads 120a and 120b, a first side 123a of the transfer pad 120a and a first side 123b of the transfer pad 120b face each other, and a second side 124a of the transfer pad 120a and a second side 124b of the transfer pad 120b back face each other.

Specifically, in the display device 100a of the embodiment, in the direction Y, the transfer pad 120a and the transfer pad 120b are adjacent to each other. The transfer pad 120a has the first side 123a and the second side 124a opposite to each other, and the transfer pad 120b has the first side 123b and the second side 124b opposite to each other. The first side 123a of the transfer pad 120a is adjacent to a first opening 151a and the second side 124a is adjacent to a second opening 161a, and the first side 123b of the transfer pad 120b is adjacent to a first opening 151b and the second side 124b is adjacent to a second opening 161b. The first side 123a of the transfer pad 120a may be regarded as the side of the first part 121a of the transfer pad 120a away from the second opening 161a, and the second side 124a of the transfer pad 120a may be regarded as the side of the second part 122a of the transfer pad 120a away from the first opening 151a. The first side 123b of the transfer pad 120b may be regarded as the side of the first part 121b of the transfer pad 120b away from the second opening 161b, and the second side 124b of the transfer pad 120b may be regarded as the side of the second part 122b of the transfer pad 120b away from the first opening 151b. In addition, openings GIc and 173c are further included between the adjacent transfer pad 120a and transfer pad 120b, so that the source (not shown) and the drain SD2 may be electrically connected to the semiconductor layer SE, respectively.

In the embodiment, in order to avoid light leakage due to the topography problem of the first openings 151a and 151b, a black matrix layer 190 of the display device 100a not only shields the scan line SL, but also shields the first openings 151a and 151b, and the edges of the first openings 151a and 151b extending outward in a range of about 3 microns.

In addition, in order to increase the aperture ratio, the display device 100a of the embodiment further provides the first openings 151a and 151b in the central region of the black matrix layer 190, and provides the second openings 161a and 161b in the periphery region of the black matrix layer 190. Specifically, by enabling the first opening 151a of the transfer pad 120a and the first opening 151b of the transfer pad 120b to face each other, and the second opening 161a of the transfer pad 120a and the second opening 161b of the transfer pad 120b to back face each other, the first openings 151a and 151b may be disposed in the central region of the black matrix layer 190. That is, the first opening 151a of the transfer pad 120a may be adjacent to the first opening 151b of the transfer pad 120b, the first opening 151a of the transfer pad 120a may be away from the second opening 161b of the transfer pad 120b, and the first opening 151b of the transfer pad 120b may be away from the second opening 161a of the transfer pad 120a. Conversely, if the first openings are disposed in the peripheral region of the black matrix layer and the second openings are disposed in the central region (not shown) of the black matrix layer, in order to ensure shielding of the edges of the first openings extending outward in the range of about 3 microns, it is necessary to additionally increase the shielding range of the black matrix layer, as a result, the aperture ratio is decreased.

In summary, in the display device according to the embodiments of the disclosure, the pixel electrode may be electrically connected to the transfer pad through the first opening of the first insulating layer, and the transfer pad may be electrically connected to the drain. Since the width of the first opening is greater than the width of the drain, and the width of the first opening is smaller than the width of the transfer pad, the contact area between the pixel electrode and the transfer pad may be increased. In this way, the display device of the embodiments can improve the electron transfer between the pixel electrode and the drain by the configuration of the transfer pad to reduce the resistance between the pixel electrode and the drain, and improve the display quality of the display device. For example, in a high-pixel display panel with a small pixel size (such as a virtual reality (VR) display panel, but not limited thereto), since the width of the drain thereof is smaller than the width of the drain of a high-pixel display panel with a large pixel size, the contact area between the pixel electrode and the drain may be too small for stable electron transfer. Therefore, if a transfer pad can be disposed in the high-pixel display panel with the small pixel size according to the teachings of the embodiments, through the electrical connection design of the transfer pad, the resistance between the pixel electrode and the drain can be reduced to meet the requirements of small pixel size and high resolution at the same time.

Finally, it should be noted that the above embodiments are only used to illustrate the technical solutions of the disclosure, but not to limit the same. Although the disclosure has been described in detail with reference to the foregoing embodiments, persons skilled in the art should understand that the technical solutions described in the foregoing embodiments may still be modified, or some or all of the technical features may be equivalently replaced. However, the modifications or replacements do not cause the essence of the corresponding technical solution to deviate from the scope of the technical solutions according to the embodiments of the disclosure.

What is claimed is:

1. An electronic device, comprising:
   a substrate;
   a data line, disposed on the substrate and extending along a first direction;
   a gate insulating layer, disposed on the substrate and comprising a first opening;
   a thin film transistor, disposed on the substrate and electrically connected to the data line, comprising a semiconductor layer and an electrode electrically connected to the semiconductor layer through the first opening of the gate insulating layer;
   a first insulating layer, disposed on the thin film transistor and comprising a second opening;
   a pixel electrode, disposed on the first insulating layer and electrically connected to the electrode through the second opening; and
   a common electrode, disposed on the pixel electrode and in the second opening,
   wherein the semiconductor layer comprises metal oxide, and the electrode comprises transparent conductive material;
   wherein the first opening and the second opening are arranged in a direction parallel to the first direction, and
   wherein, in a second direction perpendicular to the first direction, a width of the second opening is greater than a width of the electrode.

2. The electronic device according to claim 1, wherein a thickness of the first insulating layer is greater than a thickness of the gate insulating layer.

3. The electronic device according to claim 1, further comprising:
   a second insulating layer, disposed between the common electrode and the pixel electrode.

4. The electronic device according to claim 1, further comprising:
   a shielding layer, disposed between the substrate and the thin film transistor.

5. An electronic device, comprising:
   a substrate;
   a data line, disposed on the substrate and extending along a first direction;

a gate insulating layer, disposed on the substrate and comprising a first opening;

a thin film transistor, disposed on the substrate and electrically connected to the data line, comprising a semiconductor layer, an electrode electrically connected to the semiconductor layer through the first opening of the gate insulating layer, and a gate overlapped with the semiconductor layer;

a first insulating layer, disposed on the thin film transistor and comprising a second opening; and a pixel electrode, disposed on the first insulating layer and electrically connected to the electrode through the second opening;

wherein the second opening overlaps the gate, wherein the semiconductor layer comprises metal oxide, and the electrode comprises transparent conductive material;

wherein the first opening and the second opening are arranged in a direction parallel to the first direction, and wherein, in a second direction perpendicular to the first direction, a width of the second opening is greater than a width of the electrode.

6. The electronic device according to claim 5, wherein a thickness of the first insulating layer is greater than a thickness of the gate insulating layer.

7. The electronic device according to claim 5, further comprising:

a shielding layer, disposed between the substrate and the thin film transistor.

* * * * *